United States Patent
Chou et al.

(10) Patent No.: US 10,483,115 B2
(45) Date of Patent: Nov. 19, 2019

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: You-Hua Chou, Hsinchu (TW); Kuo-Sheng Chuang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 233 days.

(21) Appl. No.: 15/692,528

(22) Filed: Aug. 31, 2017

(65) Prior Publication Data

US 2018/0308702 A1 Oct. 25, 2018

Related U.S. Application Data

(60) Provisional application No. 62/489,444, filed on Apr. 24, 2017.

(51) Int. Cl.
| | |
|---|---|
| H01L 29/78 | (2006.01) |
| H01L 21/285 | (2006.01) |
| H01L 23/532 | (2006.01) |
| H01L 21/768 | (2006.01) |
| H01L 23/58 | (2006.01) |
| H01L 23/528 | (2006.01) |
| H01L 23/522 | (2006.01) |

(52) U.S. Cl.
CPC .. *H01L 21/28556* (2013.01); *H01L 21/76843* (2013.01); *H01L 21/76876* (2013.01); *H01L 21/76879* (2013.01); *H01L 23/528* (2013.01); *H01L 23/5226* (2013.01); *H01L 23/5328* (2013.01); *H01L 23/53276* (2013.01); *H01L 23/585* (2013.01)

(58) Field of Classification Search
CPC ......... H01L 21/28556; H01L 21/76843; H01L 21/76879; H01L 21/76876; H01L 23/53276; H01L 23/585; H01L 23/528; H01L 23/5328; H01L 23/5226
See application file for complete search history.

(56) References Cited

U.S. PATENT DOCUMENTS

| | | | |
|---|---|---|---|
| 9,059,274 B2 * | 6/2015 | Cao | H01L 29/66742 |
| 2014/0061916 A1 * | 3/2014 | Saito | H01L 23/5226 |
| | | | 257/751 |

* cited by examiner

*Primary Examiner* — Hoa B Trinh
(74) *Attorney, Agent, or Firm* — Maschoff Brennan

(57) ABSTRACT

A semiconductor device includes a non-insulator structure, at least one carbon nano-tube (CNT), a dielectric layer, and a graphene-based conductive layer. The CNT is over the non-insulator structure. The dielectric layer surrounds the CNT. The graphene-based conductive layer is over the at least one CNT. The CNTs and the graphene-based conductive layer have low resistance.

20 Claims, 22 Drawing Sheets

SEMICONDUCTOR DEVICE AND METHOD FOR MANUFACTURING THE SAME

RELATED APPLICATIONS

This application claims priority to U.S. provisional application No. 62/489,444, filed on Apr. 24, 2017, which is herein incorporated by reference.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
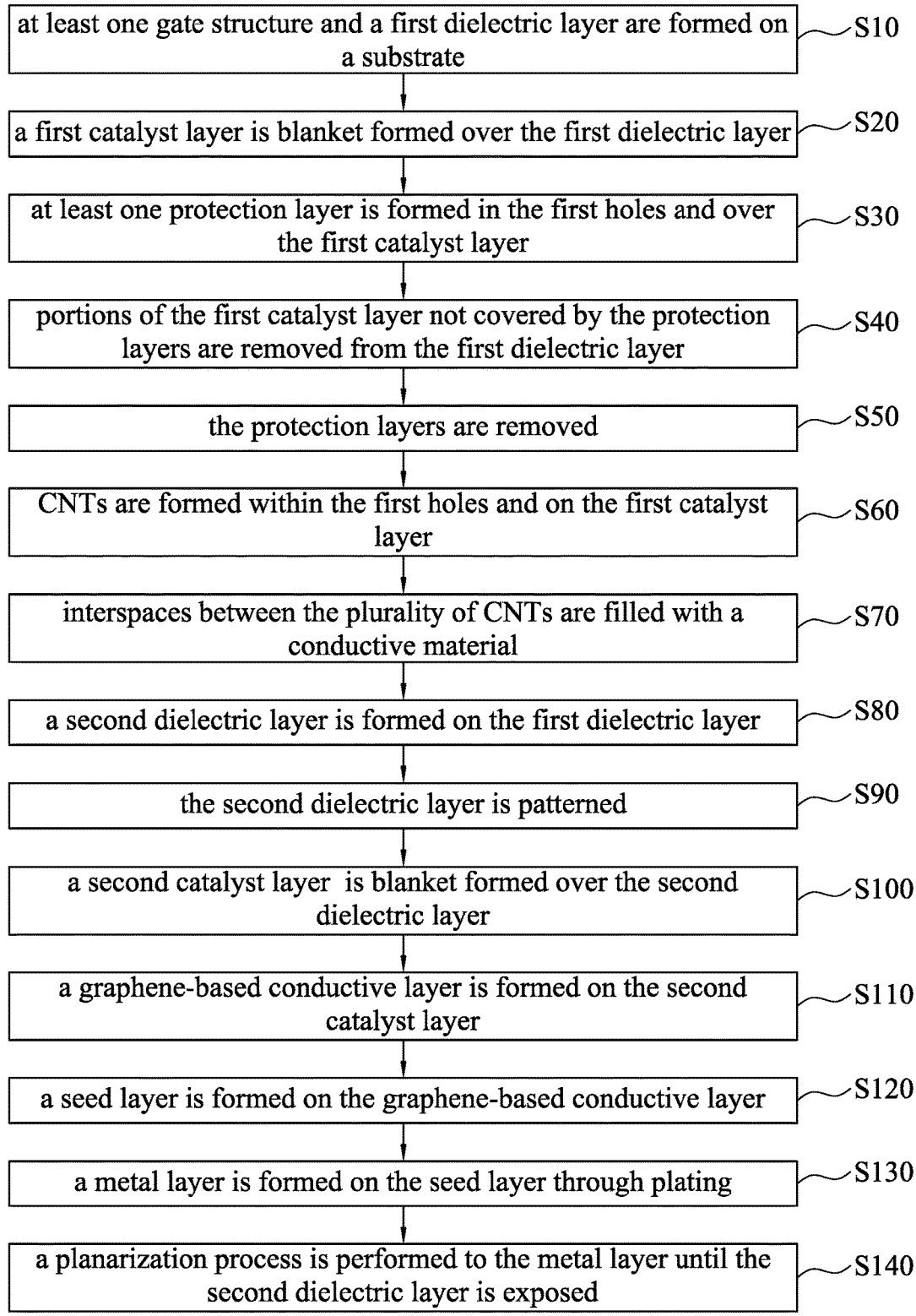
FIG. 1 is a flowchart of a method for manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. these are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
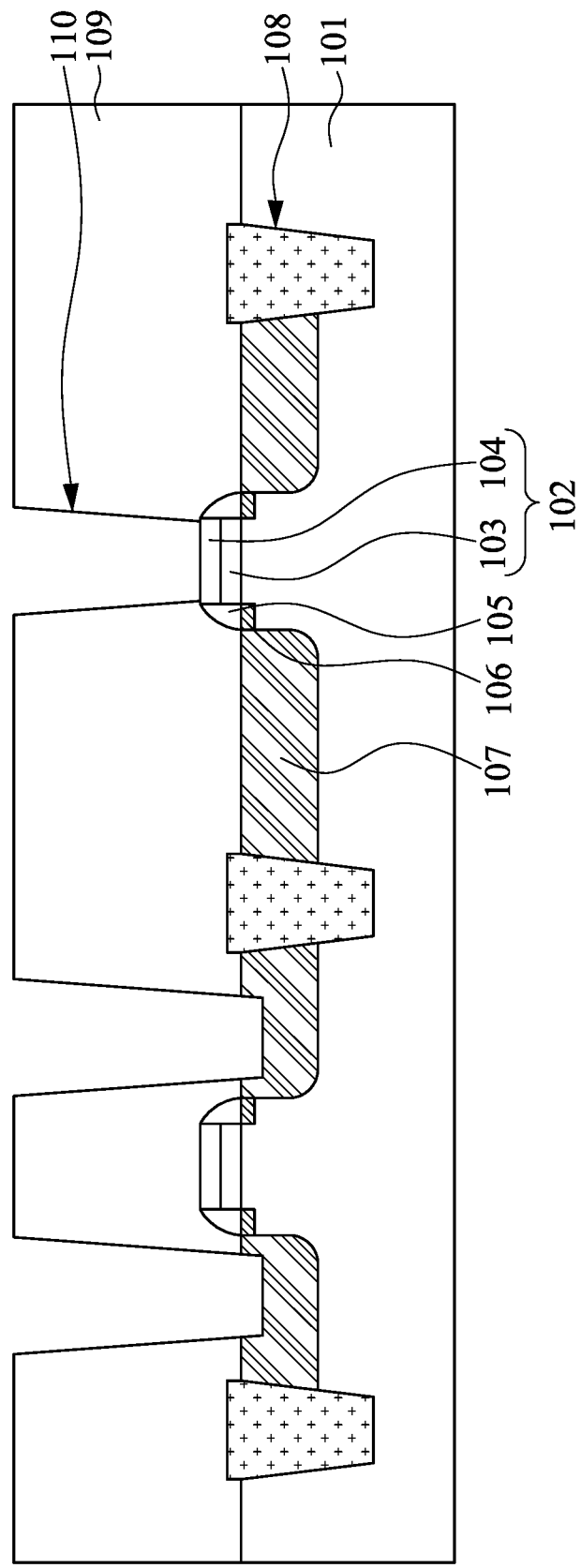
FIGS. 2-18 illustrate a method of forming a semiconductor device in accordance with some embodiments of the present disclosure.
Figure 3:
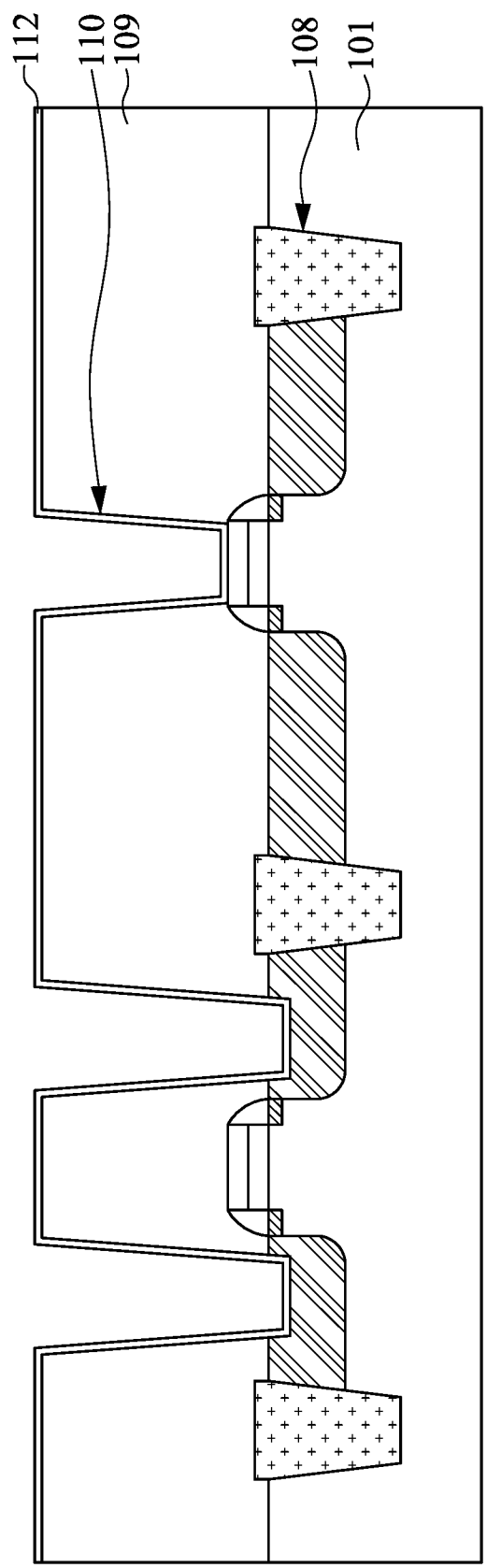
Figure 4:
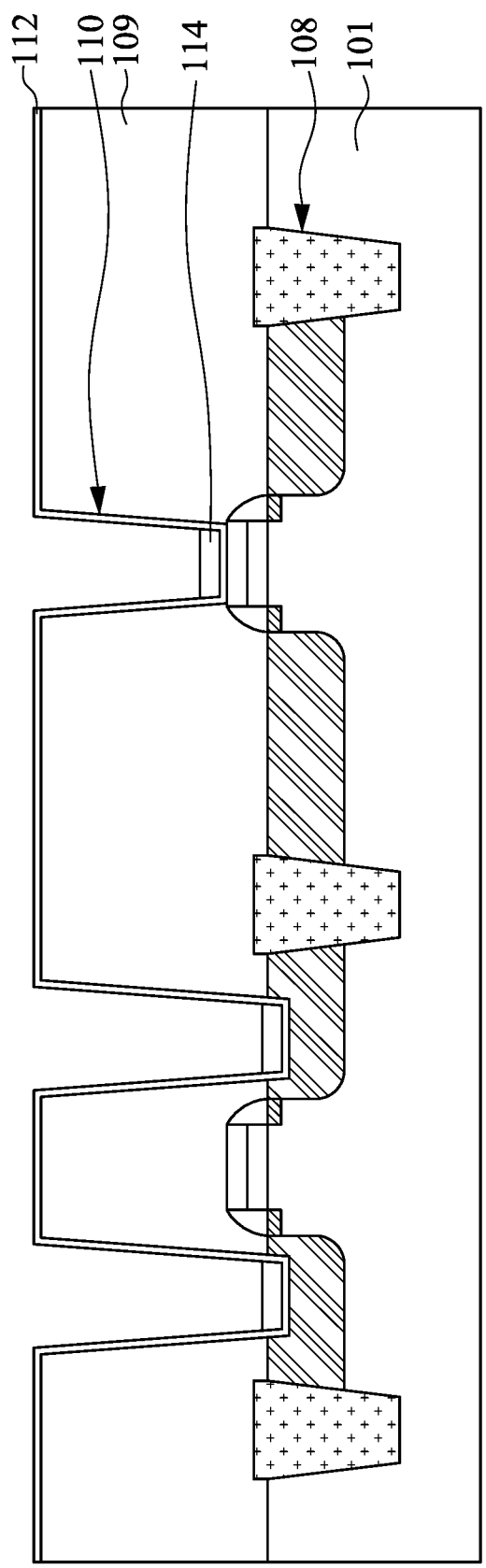
Figure 5:
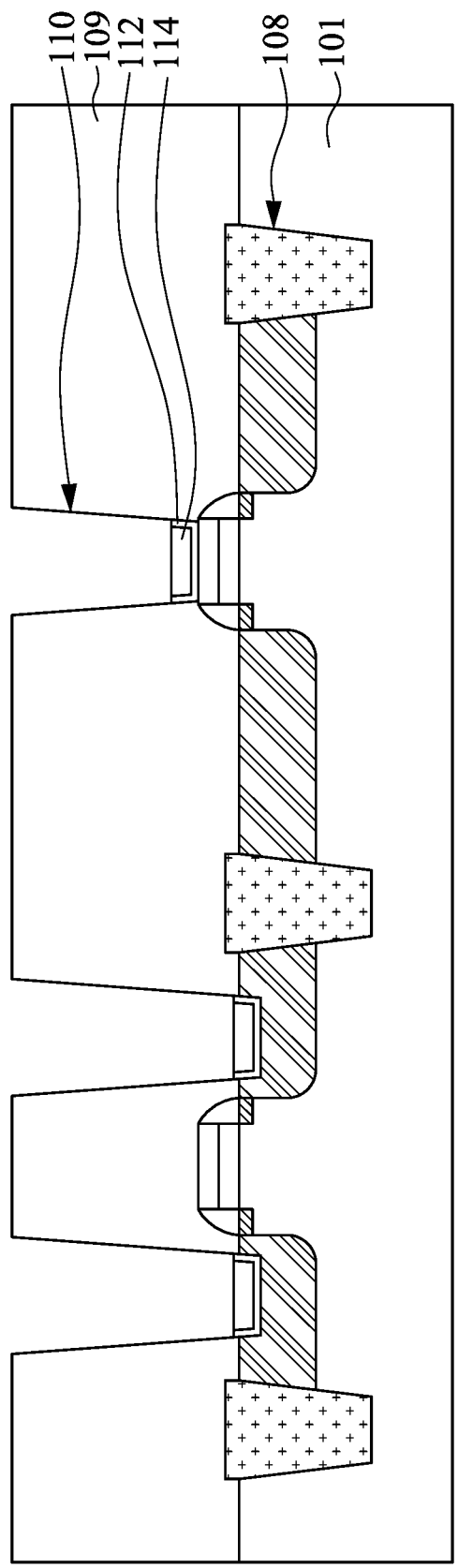
Figure 6:
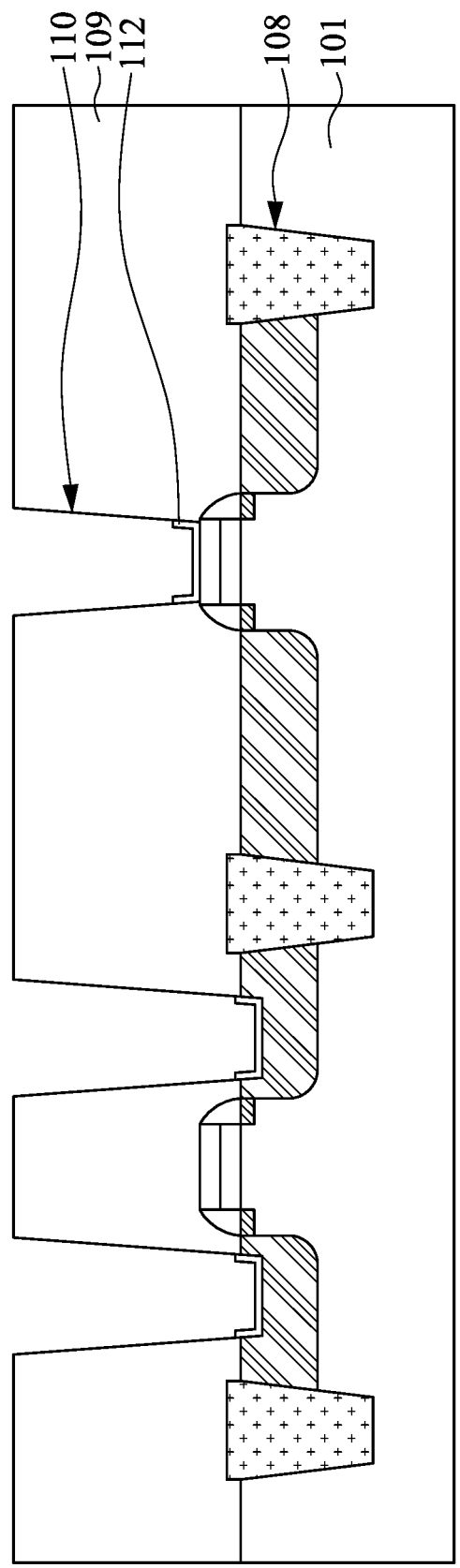
Figure 7:
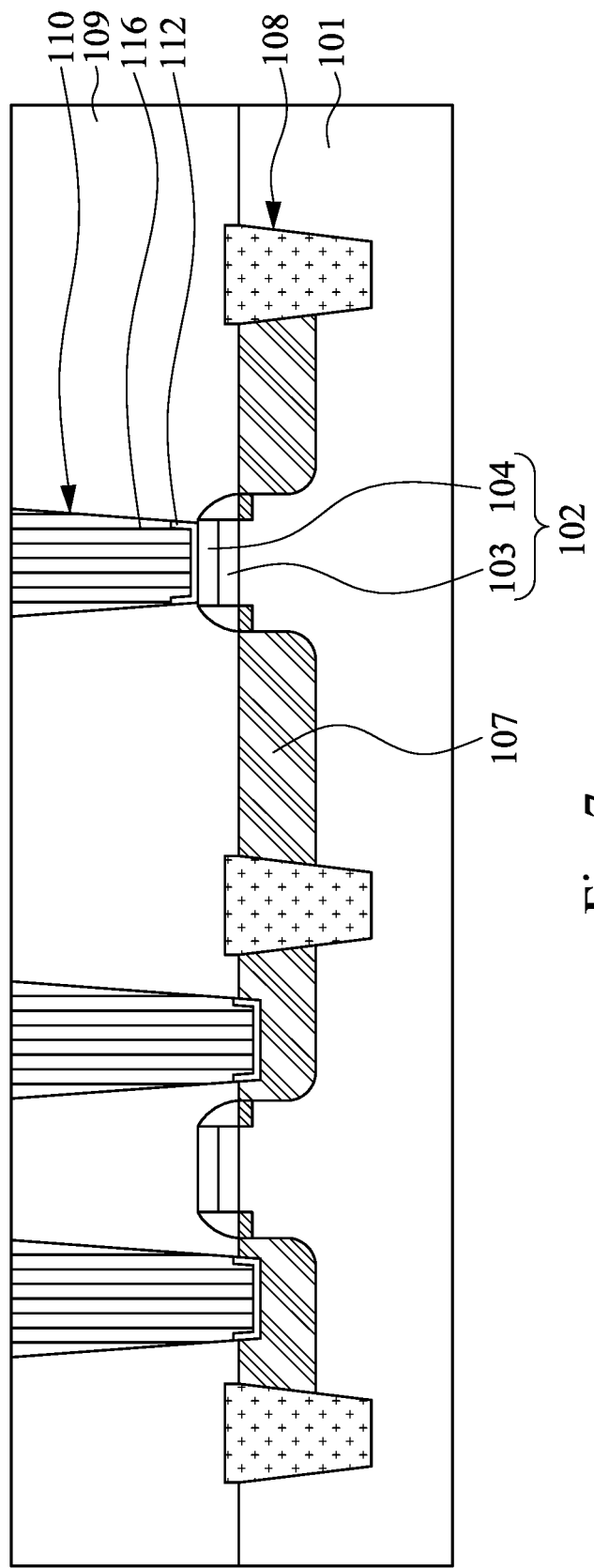
Figure 9:
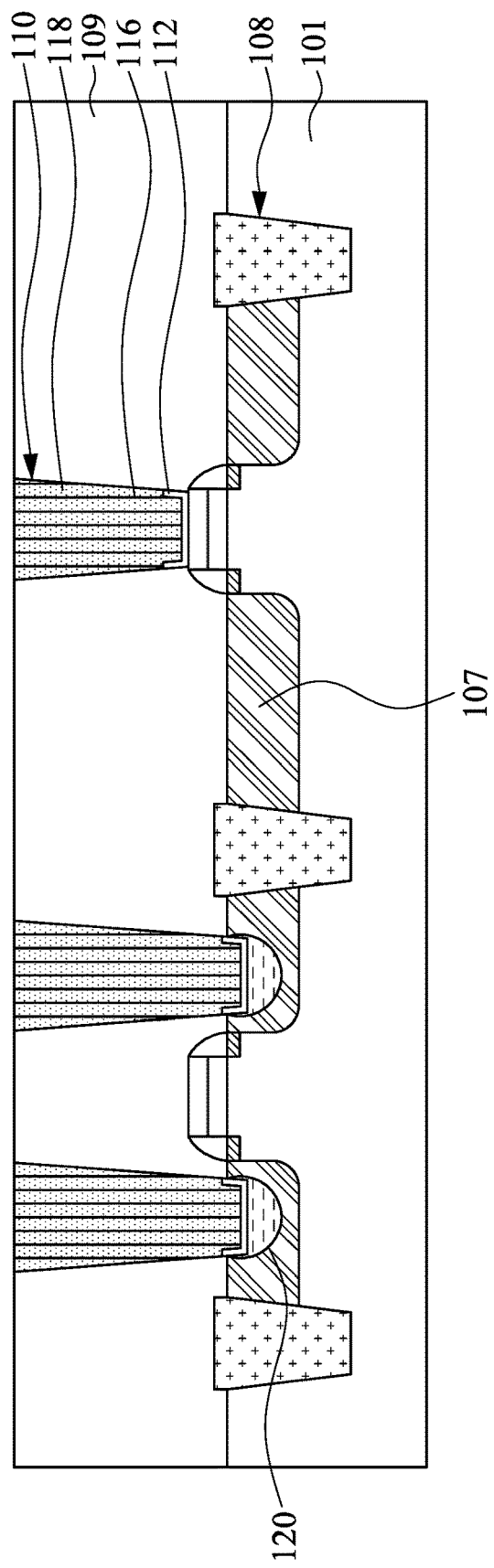
Figure 10:
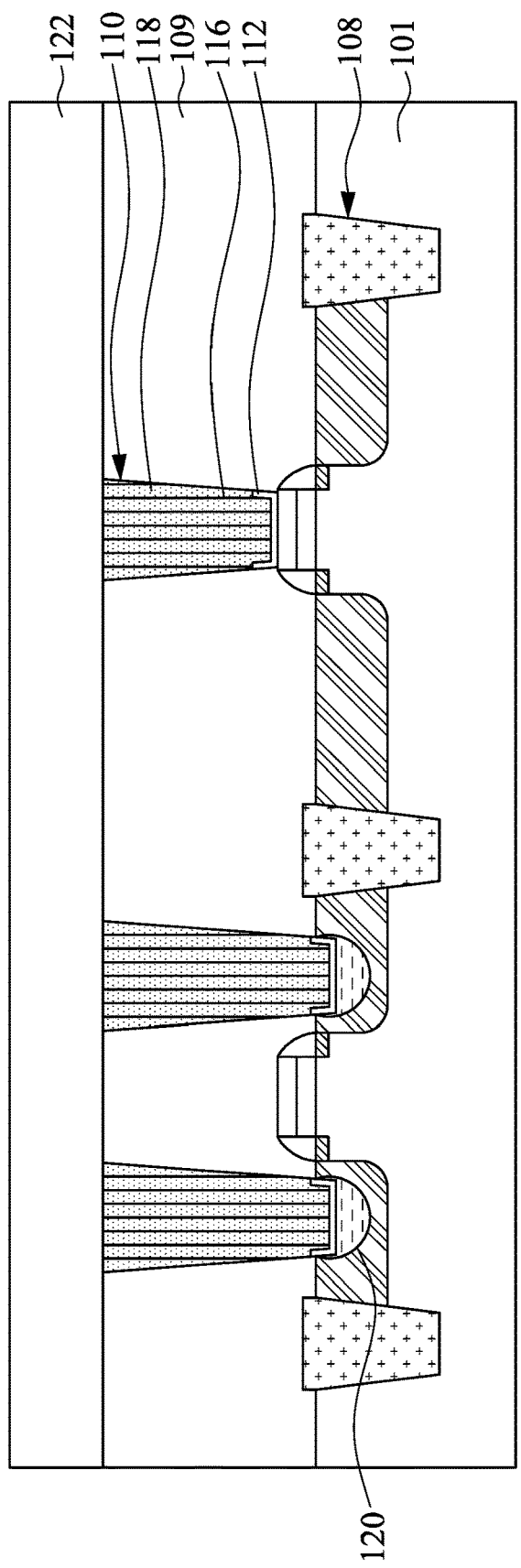
Figure 11:
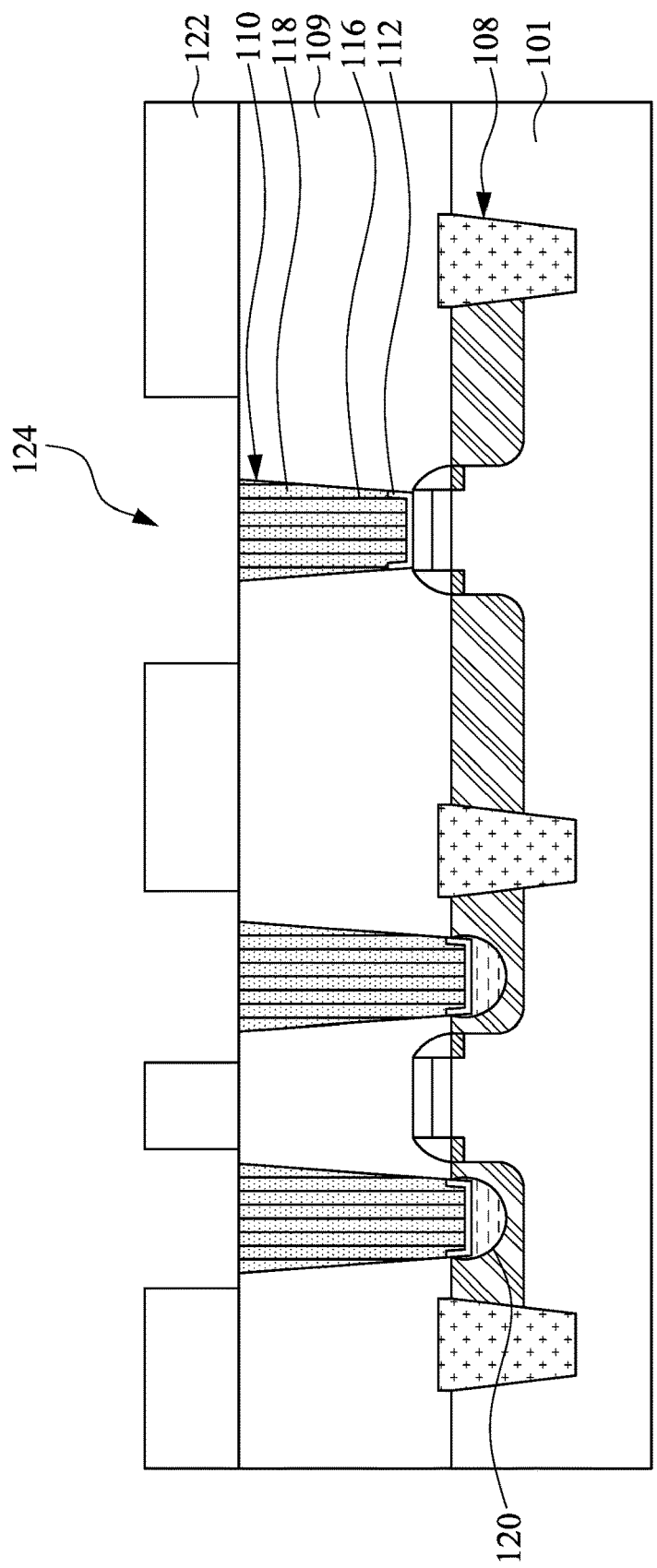
Figure 12:
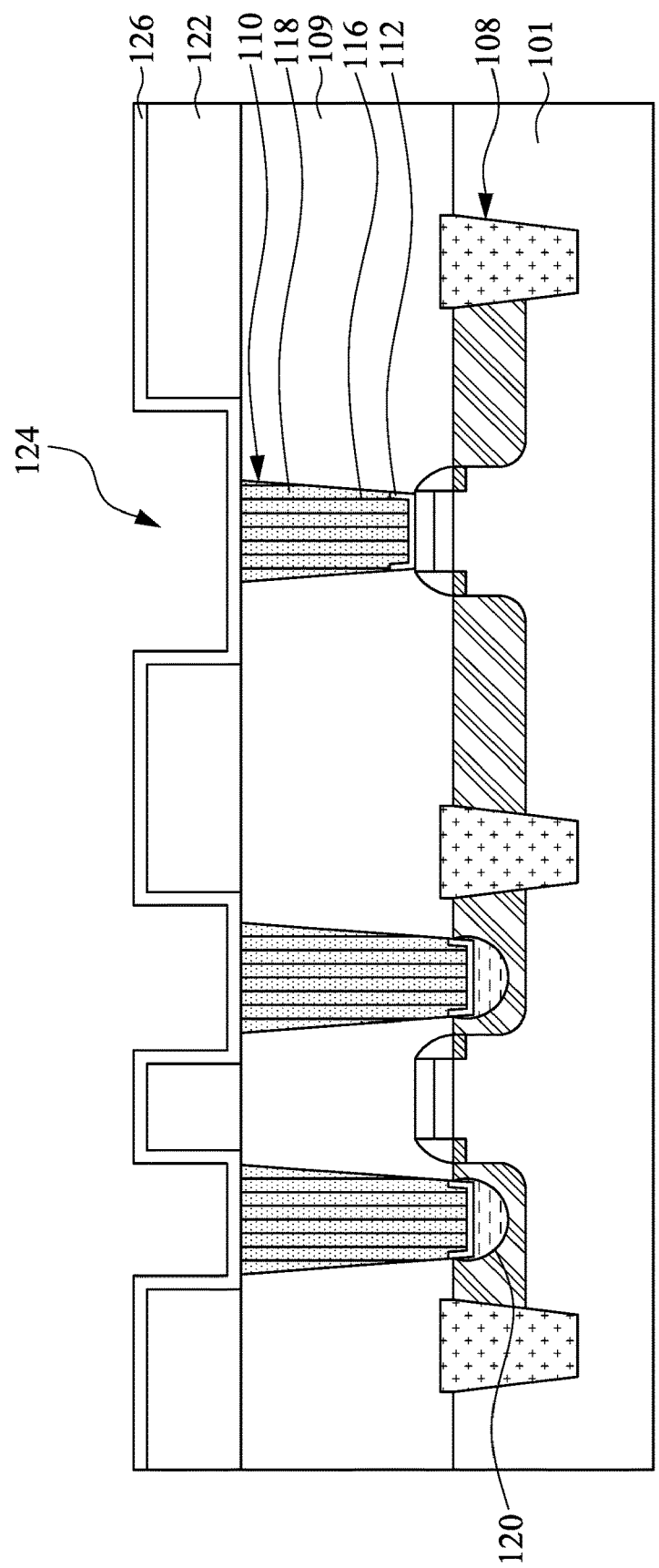
Figure 13:
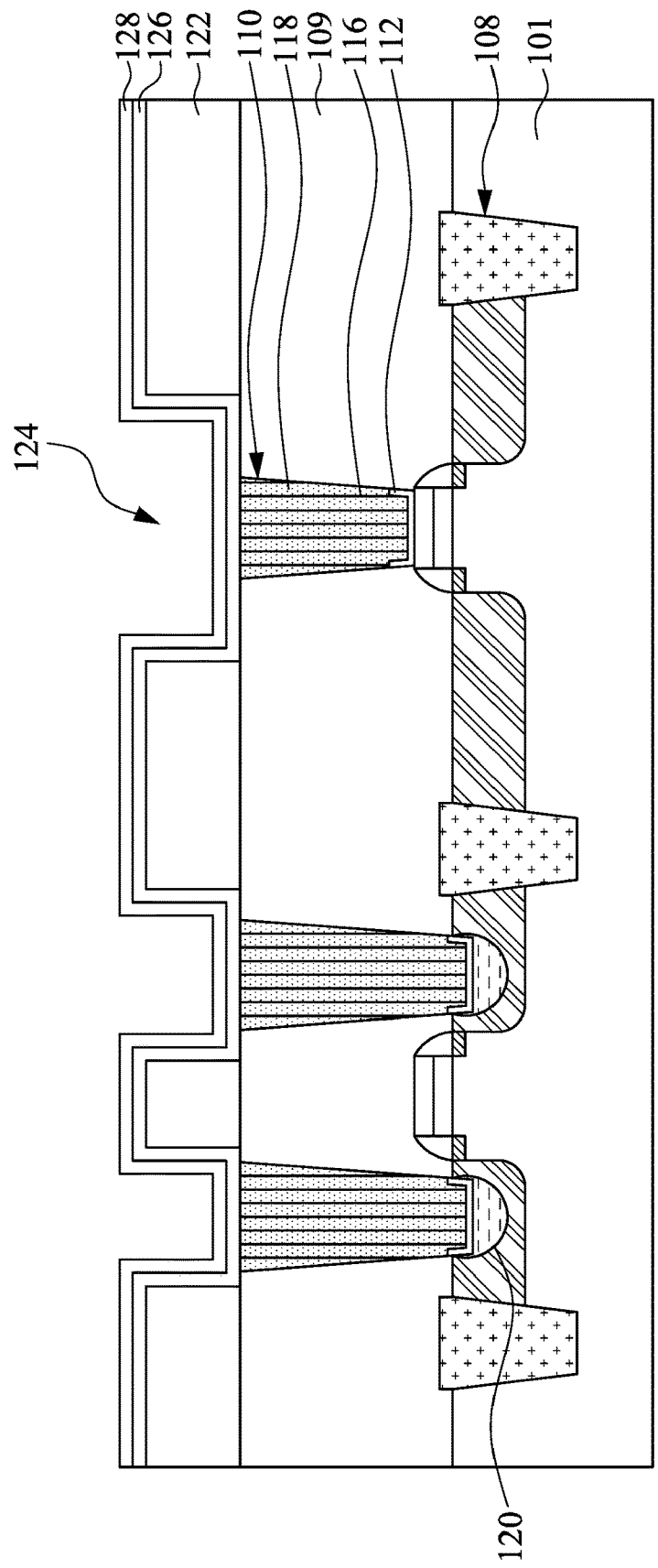
Figure 16:
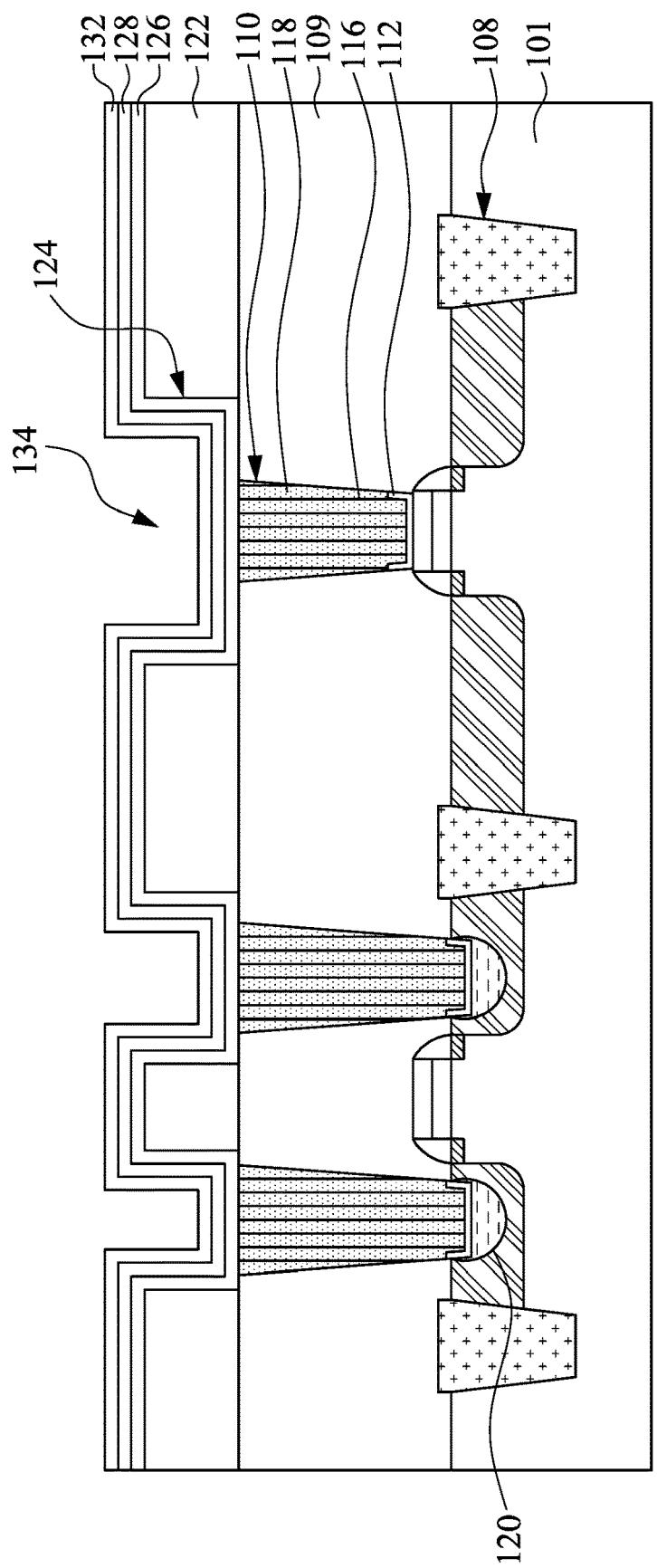
Figure 17:
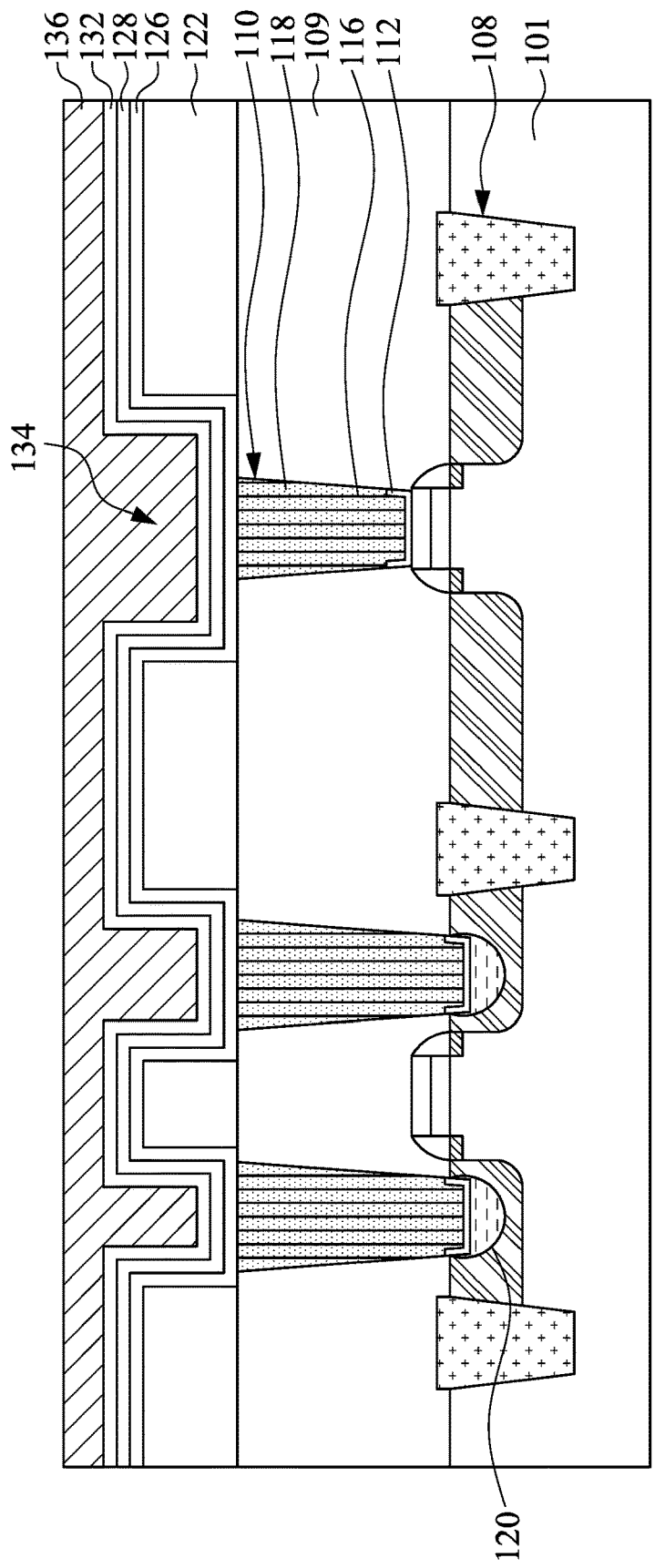
Figure 18:
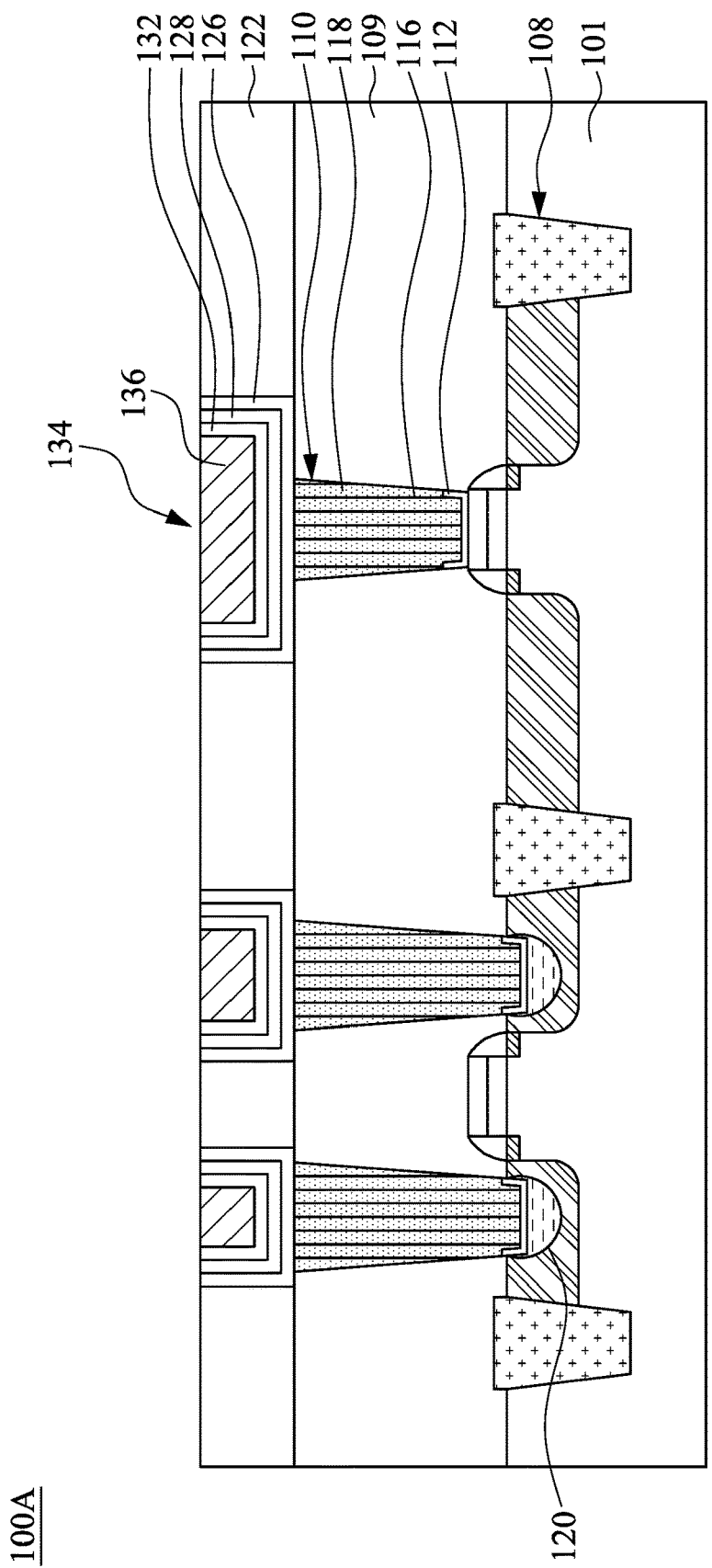

FIG. 1 is a flowchart of a method for manufacturing a semiconductor device in accordance with some embodiments of the present disclosure. FIGS. 2-18 illustrate a method of forming a semiconductor device in accordance with some embodiments of the present disclosure. The method begins with block S10 in which at least one gate structure 102 and a first dielectric layer 109 are formed on a substrate 101 (as shown in FIG. 2). The method continues with block S20 in which a first catalyst layer 112 is blanket formed over the first dielectric layer 109 (as shown in FIG. 3). The method continues with block S30 in which at least one protection layer 114 is formed in the first holes 110 and over the first catalyst layer 112 (as shown in FIG. 4). The method continues with block S40 in which portions of the first catalyst layer 112 not covered by the protection layers 114 are removed from the first dielectric layer 109 (as shown in FIG. 5). The method continues with block S50 in which the protection layers 114 are removed (as shown in FIG. 6). The method continues with block S60 in which CNTs 116 are formed within the first holes 110 and on the first catalyst layer 112 (as shown in FIG. 7). The method continues with block S70 in which interspaces between the plurality of CNTs 116 are filled with a conductive material 118 (as shown in FIG. 9). The method continues with block S80 in which a second dielectric layer 122 is formed on the first dielectric layer 109 (as shown in FIG. 10). The method continues with block S90 in which the second dielectric layer 122 is patterned (as shown in FIG. 11). The method continues with block S100 in which a second catalyst layer 126 is blanket formed over the second dielectric layer 122 (as shown in FIG. 12). The method continues with block S110 in which a graphene-based conductive layer 128 is formed on the second catalyst layer 126 (as shown in FIG. 13). The method continues with block S120 in which a seed layer 132 is formed on the graphene-based conductive layer 128 (as shown in FIG. 16). The method continues with block S130 in which a metal layer 136 is formed on the seed layer 132 through plating (as shown in FIG. 17). The method continues with block S140 in which a planarization process is performed to the metal layer 136 until the second dielectric layer 122 is exposed (as shown in FIG. 18).

As shown in FIG. 2, at least one gate structure 102 and a first dielectric layer 109 are formed on a substrate 101, in which at least one of the gate structures 102 is between the substrate 101 and the first dielectric layer 109.

In some embodiments, the substrate 101 includes a silicon substrate. In some alternative embodiments, the substrate 101 is made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the substrate 101 further includes other features such as various doped regions, a buried layer, and/or an epitaxy layer. Furthermore, in some embodiments, the substrate 101 may be a semiconductor on insulator such as silicon on insulator (SOI) or silicon on sapphire. In some embodiments, the substrate 101 includes a doped epi layer, a gradient semiconductor layer, and/or may further include a semiconductor layer overlying another semiconductor layer of a different type such as a silicon layer on a silicon germanium layer. In some embodiments, the substrate 101 includes a multilayer silicon structure or a multilayer compound semiconductor structure.

In some embodiments, the substrate 101 further includes active regions having various doping configurations. In some embodiments, the active region is doped with p-type or n-type dopants. For example, the active regions is doped with p-type dopants, such as boron or BF2; n-type dopants, such as phosphorus or arsenic; and/or combinations thereof. In some embodiments, the active regions is configured for an N-type metal-oxide-semiconductor field effect transistor (referred to as an NMOSFET), or alternatively configured for a P-type metal-oxide-semiconductor field effect transistor (referred to as a PMOSFET).

In some embodiments, at least one of the gate structures 102 includes a gate dielectric layer 103 and a gate electrode layer 104, in which the gate dielectric layer 103 is formed over the substrate 101 and the gate electrode layer 104 is formed over the gate dielectric layer 103.

In some embodiments, the gate dielectric layer 103 includes a silicon oxide, silicon oxynitride, or high-k dielectric material. A high-k dielectric material is defined as a dielectric material with a dielectric constant greater than that of $SiO_2$, and the high-k dielectric material includes metal oxide. In some embodiments, the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In some embodiments, the gate dielectric layer 103 is grown by using a suitable process, such as a chemical vapor deposition (CVD) process or an atomic layer deposition (ALD) process. In some embodiments, the gate dielectric layer 103 further includes an interfacial layer (not illustrated) to minimize stress between the gate dielectric layer 103 and the substrate 101. In some embodiments, the interfacial layer is formed of silicon oxide or silicon oxynitride grown by a thermal oxidation process. For example, the interfacial layer can be grown by a rapid thermal oxidation (RTO) process or in an annealing process comprising oxygen.

In some embodiments, the gate electrode layer 104 includes a single layer or multilayer structure. In some embodiments, the gate electrode layer 104 includes polysilicon. Furthermore, the gate electrode layer 104 may be doped poly-silicon with the uniform or gradient doping. In some embodiments, the gate electrode layer 104 is formed by using a low-pressure CVD (LPCVD) process. In some other embodiments, the gate electrode layer 104 is a metal gate.

In some embodiments, at least one pair of spacers 105 is formed to be adjacent to sidewalls of at least one of the gate structure 102, in which the spacers 105 are formed of silicon oxide, silicon nitride, silicon oxynitride, silicon carbide, fluoride-doped silicate glass (FSG), a low k dielectric material, and/or combinations thereof. In some embodiments, at least one of the spacers 105 may have a multiple-layers structure, for example, including one or more liner layers.

In some embodiments, lightly doped source and drain (LDD) regions 106 and source/drain (S/D) regions 107 are created in the active region of the substrate 101. In some embodiments, the LDD regions 106 in the substrate 101 are covered with the spacers 105, and the S/D regions 107 in the substrate 101 are laterally spaced from sides of at least one of the gate structure 102 (i.e. adjacent the regions of the substrate 101 underlying the gate structures 102). In some embodiments, the S/D regions 107 are formed by using an ion implantation. For example, an n-type dopant, such as phosphorous, or a p-type dopant, such as boron is doped into at least one portion of the substrate 101 which is not covered by the spacers 105 and the gate structures 102, so as to form the S/D regions 107.

In some embodiments, at least one the isolation region 108 is formed in the substrate 101 to isolate the various active regions of the substrate 101. The isolation regions 108 may utilize isolation technology, such as local oxidation of silicon (LOCOS) or shallow trench isolation (STI) region, to define and electrically isolate the various active regions of the substrate 101. In some embodiments, at least one of the isolation regions 108 serves as a STI region. The isolation regions 108 include silicon oxide, silicon nitride, silicon oxynitride, fluoride-doped silicate glass (FSG), a low-K dielectric material, other suitable materials, or combinations thereof.

The first dielectric layer 109 is formed over the substrate 101 and the gate structures 102, in which the first dielectric layer 109 is a multilayer dielectric structure. In the formation of the first dielectric layer 109, a first interlayer dielectric (ILD) layer is formed over the gate structures, and then a planarization process, such as a chemical mechanical polishing (CMP) process, is performed to planarize a top surface of the first ILD layer with the gate structures 102. The first ILD layer may include a semiconductor oxide, a semiconductor nitride, a semiconductor oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, and/or combinations thereof. Furthermore, a tensile SiN contact etch stop layer is deposited before the formation of the first ILD layer.

Next, polysilicon in the gate structures 102 is removed, in which the polysilicon is removed via etching from at least one of the gate structures 102. Afterwards, metal gates are formed in trench remaining from the removed polysilicon in at least one of the gate structures 102. The metal gate can be formed of one or more layers including the following deposited metals in order: TaN, TiN, TaN, TiN and Al (with trace amounts of Cu). As a result, the gate structures 102 are metal gate stack.

A second ILD layer is formed over the gate structures 102 and the first ILD layer, and hence the first and second ILD layers are in combination serving as the first dielectric layer 109, as depicted in FIG. 2. The second ILD layer may have a similar composition to the first ILD layer or may include different materials and/or different arrangements. For example, the second ILD layer may include a semiconductor oxide, a semiconductor nitride, a semiconductor oxynitride, TEOS oxide, PSG, BPSG, FSG, carbon doped silicon oxide, Black Diamond®, Xerogel, Aerogel, amorphous fluorinated carbon, Parylene, BCB, SILK, polyimide, other suitable materials, and/or combinations thereof. In the present embodiments, the second ILD layer is undoped silicate glass (USG). The USG of the second ILD layer is formed by a deposition using $SiH_4/N_2O/He$. The second ILD layer can be formed on top of the first ILD layer, or the first ILD layer can be removed, and/or additional combinations of dielectric materials can be formed.

After the formation of the first dielectric layer 109, a layer of photoresist (PR) is applied to the top surface of the first dielectric layer 109, and the PR is patterned, such as by a photolithography or e-beam process. An etching process is performed on the first dielectric layer 109 according to the patterned PR. The etching process may utilize a directional, or anisotropic, etching technique configured to etch vertically through the first dielectric layer 109 with minimal lateral etching. This produces first holes 110 in the first dielectric layer 109 for subsequent contact formation. While an anisotropic etching technique is shown, the etching process may include any suitable anisotropic or isotropic etching technique including dry etching, wet etching, reactive ion etching RIE, and combinations thereof. Furthermore, the etching process may use any suitable etch chemistry or combination thereof. In some embodiments, the etchants and other etching parameters may be tuned so that the exposed material of the first dielectric layer 109 is removed without etching other materials such as the materials of the gate structures. For example, in the present embodiments, a dry, anisotropic plasma etch equipped with fluorine-containing gases, such as $CF_4$, $CH_2F_2$, or $C_4F_6$, is used. In order to achieve a proper etch profile and selectivity, the anisotropic plasma etch may include multiple etch portions, such as a main etch, an over etch and a post etch treatment. In the illustrated embodiments, the dry etch creates first holes 110 with substantially vertical profiles that stop at the top surfaces of the gate structures 102 and the S/D regions 107. As a result, the first holes 110 above the gate structures 102 can be referred to as gate contact holes, and the first holes 110 above the S/D regions 107 can be referred to as source/drain contact holes.

As shown in FIG. 3, a first catalyst layer 112 is blanket formed over the first dielectric layer 109. In some embodiments, upper surfaces of the substrate 101, at least one of the gate structures 102, and the first dielectric layer 109 are covered with the first catalyst layer 112. In some embodiments, the first catalyst layer 112 is formed by using a suitable deposition process. The first catalyst layer 112 includes, for example, at least one metal, such as titanium, iron, cobalt, nickel, cooper, or combinations thereof.

As shown in FIG. 4, at least one protection layer 114 is formed in the first holes 110 and over the first catalyst layer 112. In some embodiments, the protection layers 114 are respectively present in bottoms of the first holes 110. The protection layers 114 are in contact with the first catalyst layer 112. In some embodiments, the protection layers 114 are formed by using a suitable process, such as a spin coating process. In some embodiments, at least one of the protection layers 114 includes an organic material.

As shown in FIG. 5, portions of the first catalyst layer 112 not covered by the protection layers 114 are removed from the first dielectric layer 109. In some embodiments, an etching process is used to remove these uncovered portions of the first catalyst layer 112 of FIG. 4. The etching process includes a wet etching, a dry etching process, or a combination thereof. After the etching process, portions of the first catalyst layer 112 covered by the protection layers 114 remain in the first holes 110. In some embodiments, after the etching process, the remaining portions of the first catalyst layer 112 are located at the bottoms of the first holes 110.

As shown in FIG. 6, the protection layers 114 as shown in FIG. 5 are removed. After removing the protection layers 114, the remaining portions of the first catalyst layer 112 within the first holes 110 are exposed.

Figure 8:
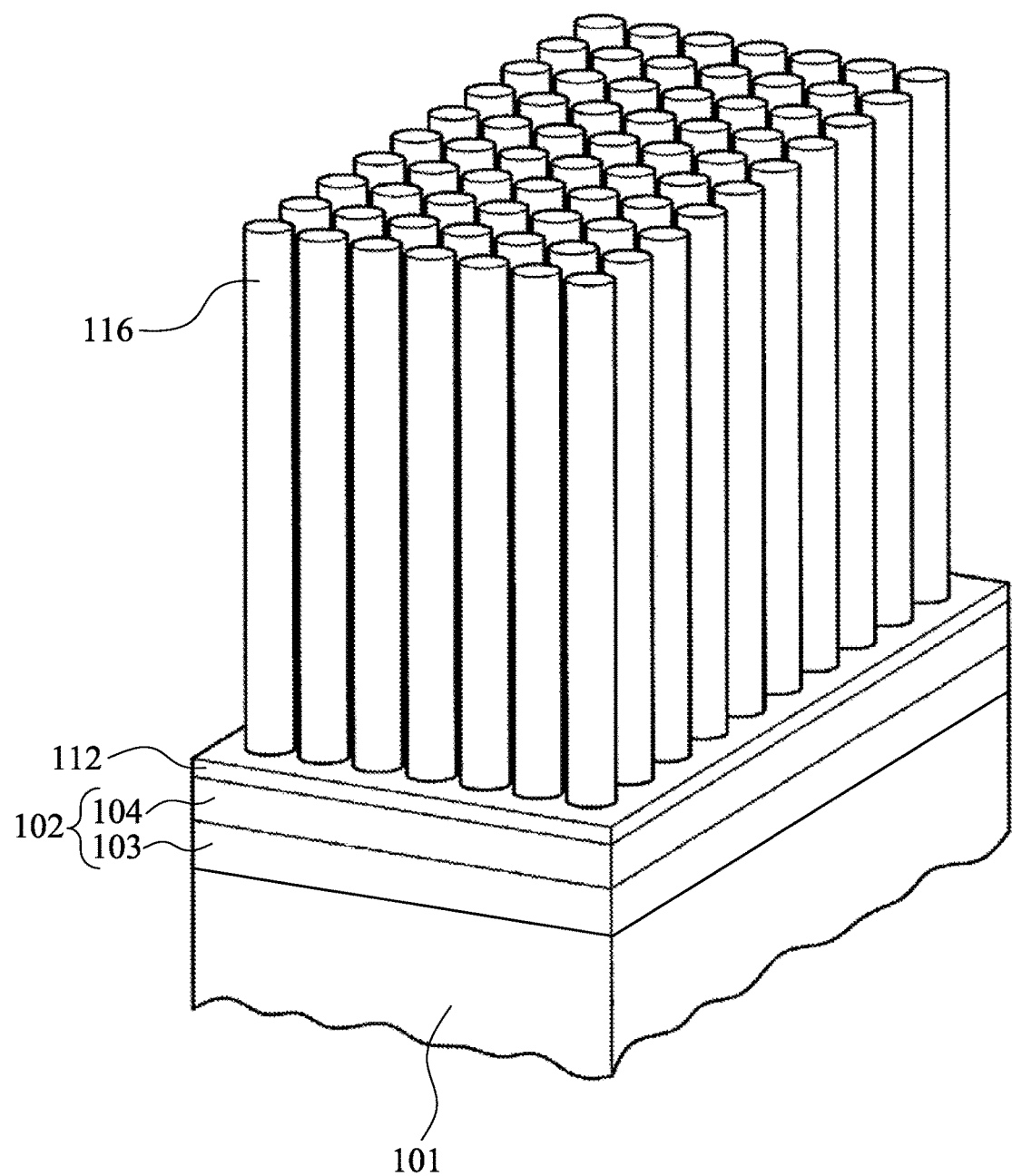

As shown in FIGS. 7 and 8, in which FIG. 8 is a perspective view of carbon nano-tubes (CNTs) 116. CNTs 116 are formed within the first holes 110 in the first dielectric layer 109 and on the first catalyst layer 112. For example, the first dielectric layer 109 surrounds the CNTs 116. In some embodiments, the CNTs 116 are grown from the first catalyst layer 112 by using a suitable process, such as a CVD process, a physical vapor deposition (PVD) process, or an atomic layer deposition (ALD) process. Furthermore, since the CNTs 116 are grown from the first catalyst layer 112, the first catalyst layer 112 is in contact with the CNTs 116. In some embodiments, after the growth of the CNTs 116, a planarization process is performed on the first dielectric layer 109 and the CNTs 116, such as a chemical mechanical polishing (CMP) process.

The first holes 110 are filled with dozens or hundreds of the CNTs 116 that extend through the thickness of the first dielectric layer 109. In some embodiments, the CNTs 116 are electrically conductive and include hollow tubes, and interspaces of the CNTs 116 are unfilled. In some embodiments, a group of the CNTs 116 vertically overlapping with the corresponding gate structures 102 is electrically coupled with this gate structure 102. In some embodiments, a group of the CNTs 116 vertically overlapping with the corresponding S/D regions 107 is electrically coupled with this the S/D region 107. An array of the patterns for CNTs 116 may be formed over a single conductive feature, such as a first catalyst layer 112 within a first hole 110. The array of the CNTs 116 may comprise a square or rectangular shape in a top view of the semiconductor device, for example. The array may alternatively comprise other shapes in a top view, such as a circle, oval, trapezoid, or other shapes.

As shown in FIG. 9, interspaces between the plurality of CNTs 116 are filled with a conductive material 118. In some embodiments, the conductive material 118 includes a metal, such as titanium, cobalt, nickel, platinum, erbium or palladium. In some embodiments, the conductive material 118 includes a metal, and the metal wraps around the CNTs 116. In some embodiments, the conductive material 118 including the metal is formed by using a suitable process, such a CVD process, a metal organic CVD (MOCVD) process, a PVD process, or an ALD process. After the formation of the conductive material 118, the conductive material 118 encapsulates the CNTs 116. For example, the CNTs 116 act as electrical channels for transmission of charges, and the conductive material 118 acts as a support for supporting the CNTs 116 within the first holes 110. Moreover, the conductive material 118 can also act as electrical channels in some embodiments.

On the other hand, after the formation of the conductive material 118, silicide regions 120 may be formed on the S/D regions 107. In some embodiments, if the conductive material 118 and the first catalyst layer 112 are made of the same material, such as titanium, the conductive material 118 and the first catalyst layer 112 causes a reaction between the underlying silicon and the metal material of the conductive material 118 and the first catalyst layer 112 to form the silicide regions 120. In some embodiments, the silicide regions 120 include a material selected from titanium silicide, cobalt silicide, nickel silicide, platinum silicide, erbium silicide, or palladium silicide. For example, in the case that the conductive material 118 and the first catalyst layer 112 include titanium, and the S/D regions 107 include silicon, the silicide regions 120 include titanium silicide.

As shown in FIG. 10, a second dielectric layer 122 is formed on the first dielectric layer 109. In some embodiments, the second dielectric layer 122 is a low k dielectric layer and has a low dielectric constant (k less than or equal to about 4.0), in which the second dielectric layer 122 is formed by using a suitable process, such as a PECVD process.

As shown in FIG. 11, the second dielectric layer 122 is patterned. In some embodiments, the patterning process includes etching process using a patterned mask as its etching mask (not shown). After the patterning process, the second dielectric layer 122 has second holes 124 over the first holes 110. Accordingly, the CNTs 116 and the conductive material 118 are exposed at bottoms of the second holes 124.

As shown in FIG. 12, a second catalyst layer 126 is blanket formed over the second dielectric layer 122. In some embodiments, the CNTs 116 and the conductive material 118 are in between the first catalyst layer 112 and the second catalyst layer 126. In some embodiments, at least one of the CNTs 116 has opposite ends in contact with the first catalyst layer 112 and the second catalyst layer 126 respectively, and the conductive material 118 has opposite surfaces in contact with the first catalyst layer 112 and the second catalyst layer 126 respectively. In some embodiments, upper surfaces of the first dielectric layer 109, the CNTs 116, the conductive material 118 and the second dielectric layer 122 are covered with the second catalyst layer 126. In some embodiments, the second catalyst layer 126 is formed by using a suitable deposition process, in which the second catalyst layer 126 includes at least one metal, such as nickel iron, cobalt, cooper, or combinations thereof.

As shown in FIG. 13, a graphene-based conductive layer 128 is formed on the second catalyst layer 126. In some embodiments, at least one portion of the graphene-based conductive layer 128 is formed in the second holes 124 and over the CNTs 116. In some embodiments, the second catalyst layer 126 wraps around the graphene-based conductive layer 128. In some embodiments, the graphene-based conductive layer 128 is formed by using a carbon deposition process. In some embodiments, the graphene-based conductive layer 128 is formed by using a gas-phase growth process, and thus the graphene-based conductive layer 128 is grown from and over the second catalyst layer 126. In some embodiments, the graphene-based conductive layer 128 is formed by using a suitable process, such as a CVD process, an atmospheric pressure CVD (APCVD) process, a LPCVD process at a sub-atmospheric pressure, a PECVD process, an atomic layer CVD (ALCVD) process, or combinations thereof. For example, in some embodiments, the graphene-based conductive layer 128 is formed by using $CH_4+H_2+Ar$. In some embodiments, after the formation of the graphene-based conductive layer 128, the second catalyst layer 126 is between the graphene-based conductive layer 128 and at least one of the CNTs 116, and the graphene-based conductive layer 128 is electrically coupled with at least one of the CNTs 116.

Figure 14:
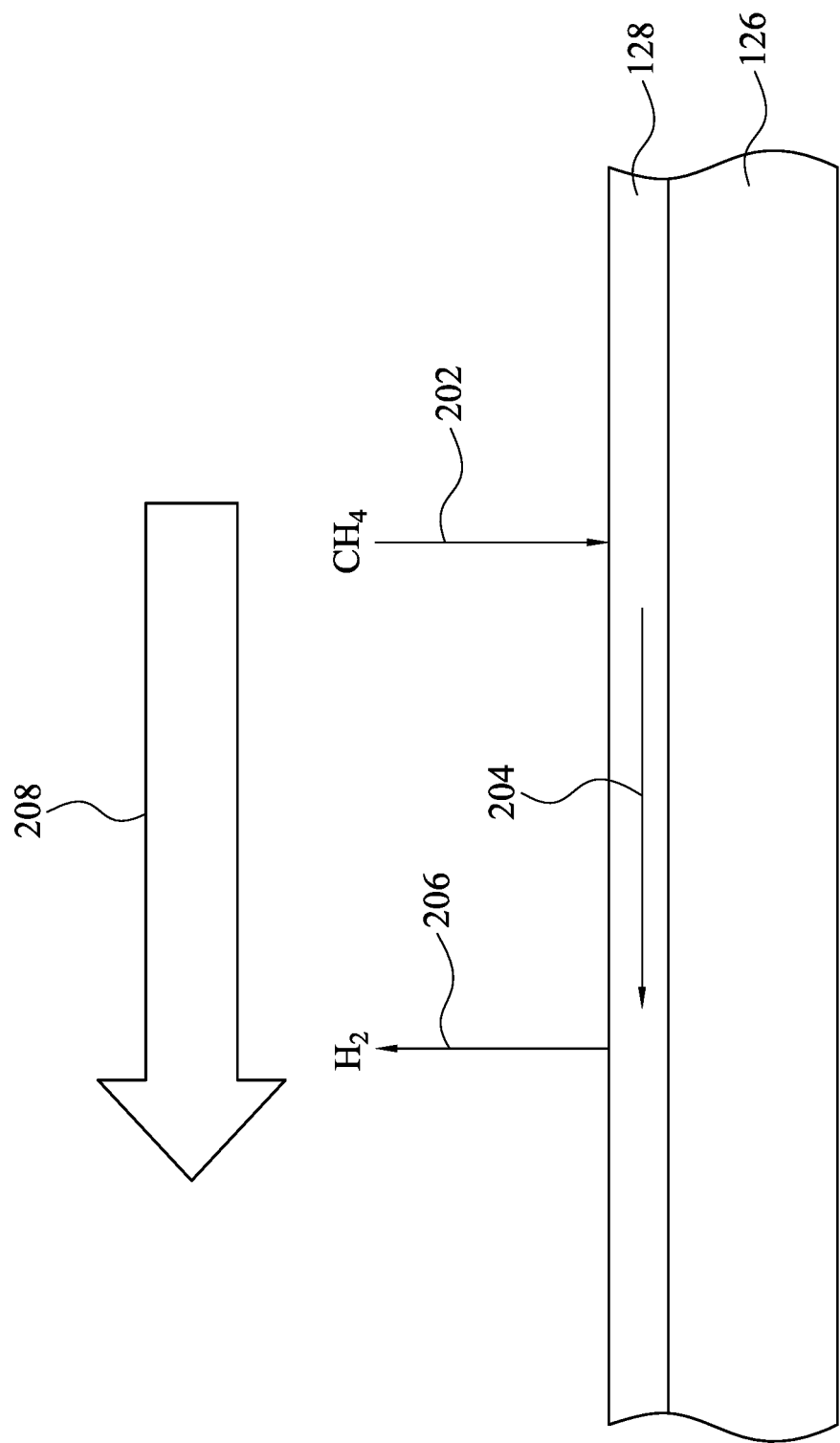

FIG. 14 illustrates formation of the graphene-based conductive layer 128. To form the graphene-based conductive layer 128, a gas flow 208 of $CH_4+H_2+Ar$ is introduced into a chamber that the semiconductor device is being processed in. At time period 202, $CH_4$ diffuses (e.g., as a gas layer near the surface, in a reaction-control region) onto the upper surface of the second catalyst layer 126 and reaches the upper surface of the second catalyst layer 126. At time period 204, the carbon within the $CH_4$ becomes adsorbed onto the surface of the second catalyst layer 126, and the carbon molecules are decomposed to form active carbon species. The active carbon species are diffused onto the surface of the second catalyst layer 126, or the active carbon species are diffused into the second catalyst layer 126 close to the upper surface of the second catalyst layer 126, to form a graphene lattice of a graphene sheet (GS) material. In active species, such as hydrogen, become desorbed from the surface and form molecular hydrogen. At time period 206, the molecular hydrogen ($H_2$) is diffused away from the upper surface of the second catalyst layer 126 through the boundary layer and is swept away by the bulk gas flow 208.

Figure 15:
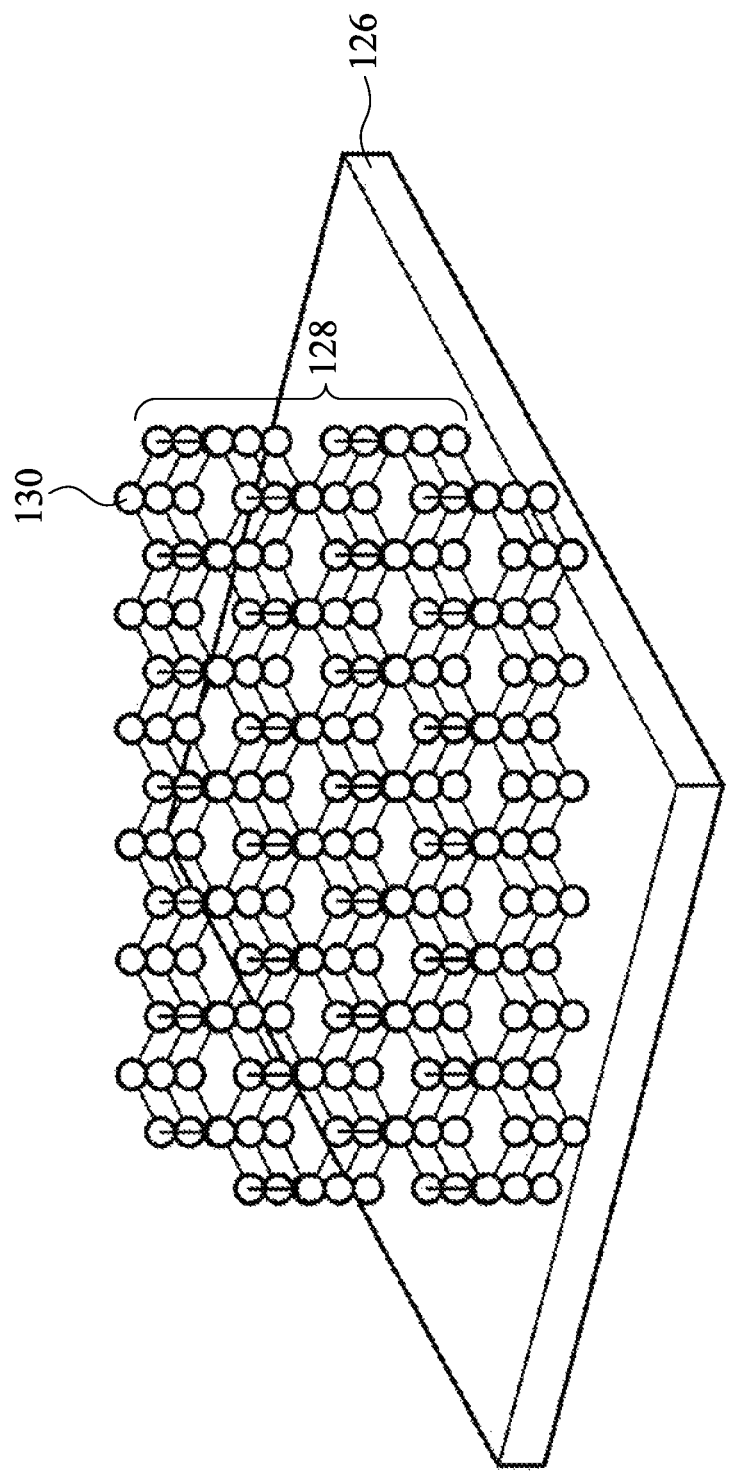

FIG. 15 is a perspective view of the graphene-based conductive layer 128 having a plurality of graphene sheets (GSs) 130 in accordance with some embodiments. In some embodiments, the graphene-based conductive layer 128 has one or more GSs 130 that are formed on the upper surface of the second catalyst layer 126. For example, the graphene-based conductive layer 128 has a few layers of the GSs 130 formed by selective growth. The GSs 130 are uniform and continuous, and are formed by layer-by-layer bottom-up growth in some embodiments. In some embodiments, the graphene-based conductive layer 128 has a thickness of about 0.1 nm to about 20 nm. In some embodiments, the graphene-based conductive layer 128 may include other materials and dimensions, and may be formed using other methods.

As shown in FIG. 16, a seed layer 132 is formed on the graphene-based conductive layer 128 using suitable deposition techniques, such as PVD. The seed layer 132 may include copper, copper alloy, aluminum, titanium, titanium alloy, or combinations thereof. In some embodiments, the seed layer 132 includes a titanium layer and a copper layer over the titanium layer. In alternative embodiments, the seed layer 132 is a copper layer. In some embodiments, the seed layer 132 has recesses 134 in the second holes 124.

As shown in FIG. 17, a metal layer 136 is formed on the seed layer 132 through plating, which may be electro plating or electro-less plating. In some embodiments, the recesses 134 in the seed layer 132 are filled by the metal layer 136. The metal layer 136 may include copper, aluminum, tungsten, nickel, solder, or alloys thereof. In some embodiments where the metal layer 136 includes copper, the second catalyst layer 126 can act as a barrier layer for preventing copper diffusion.

As shown in FIG. 18, a planarization process is performed to the metal layer 136 until the second dielectric layer 122 is exposed. In some embodiments, remaining second metal layers 136 are referred as conductors embeddedly retained in the recesses 134, and the conductors vertically overlap with CNTs 116 within the first holes 110 respectively. In some embodiments, top surfaces of the conductors are substantially level with a top surface of the graphene-based conductive layer 128, and a top surface of the second catalyst layer 126 is substantially level with the top surface of the graphene-based conductive layer 128. In some embodiments, the graphene-based conductive layer 128 wraps around the remaining second metal layers 136. In some embodiments, the planarization process includes a CMP process.

Figure 19:
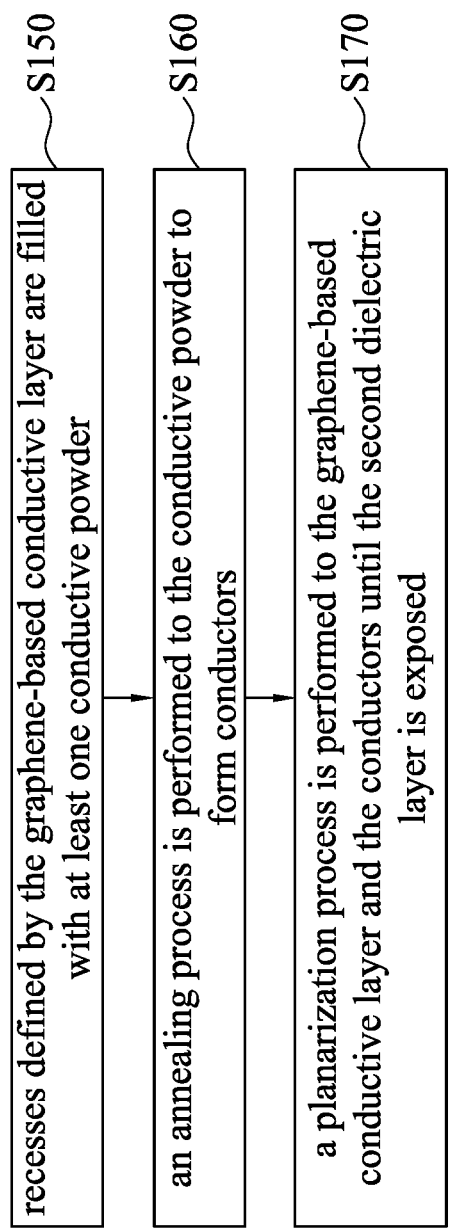
FIG. 19 is a flowchart of a method for manufacturing a semiconductor device in accordance with some embodiments of the present disclosure.
Figure 20:
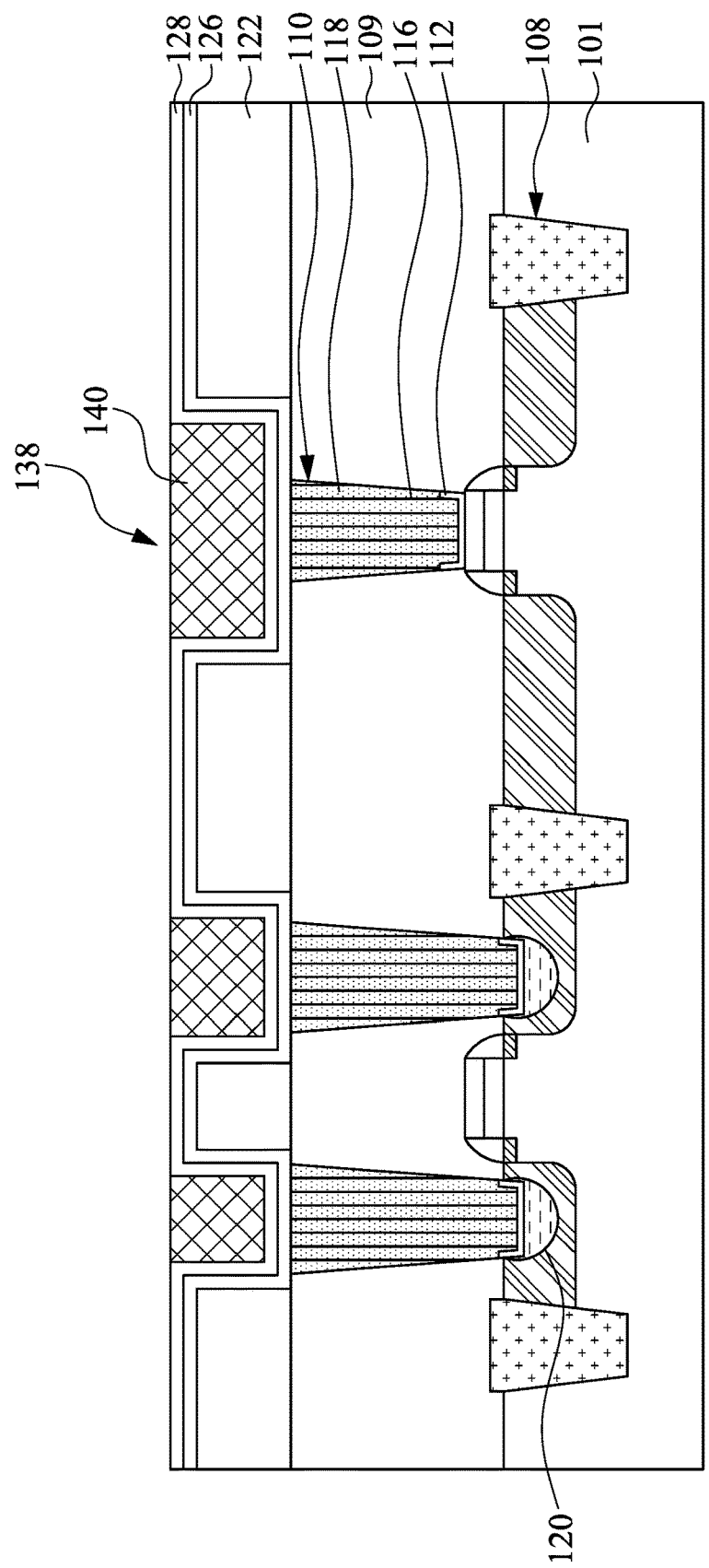
FIGS. 20-22 illustrate a method of forming a semiconductor device in accordance with some embodiments of the present disclosure.
Figure 21:
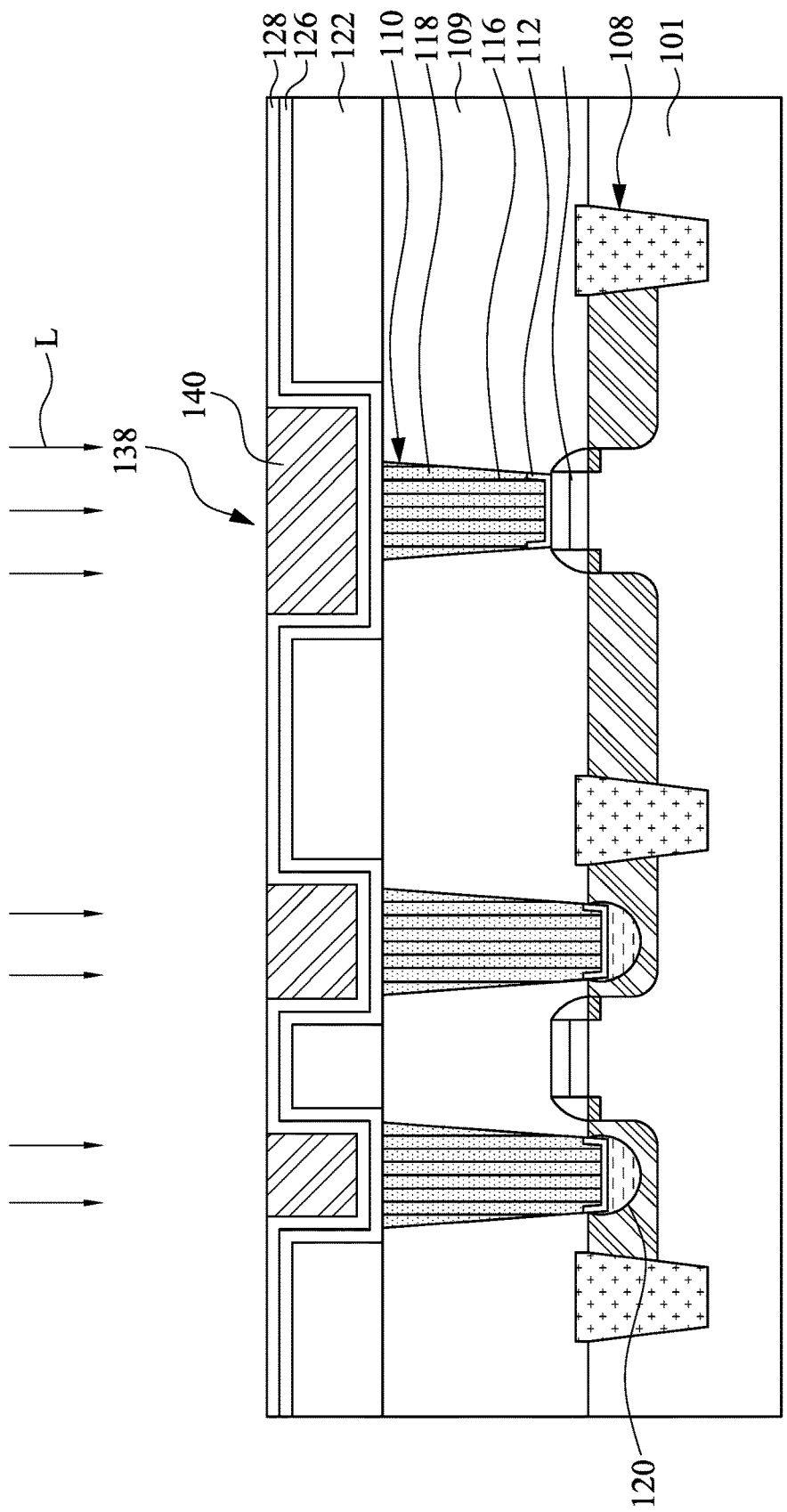
Figure 22:
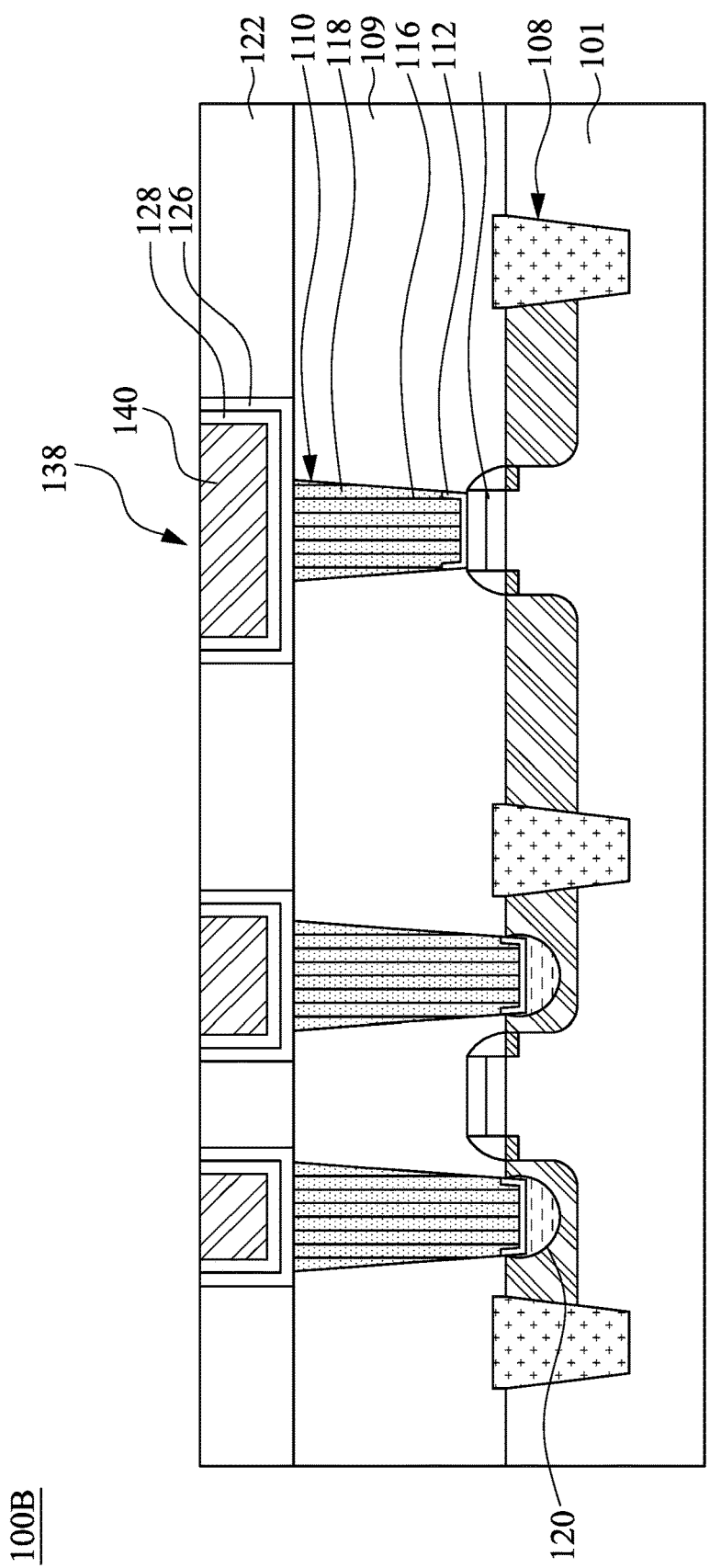

FIG. 19 is a flowchart of a method for manufacturing a semiconductor device in accordance with some embodiments of the present disclosure. FIGS. 20-22 illustrate a method of forming a semiconductor device in accordance with some embodiments of the present disclosure. Operations performed before the block S150 are as described in FIGS. 2-18, and hence they are not repeated herein. The method continues with block S150 in which recesses 138 defined by the graphene-based conductive layer 128 are filled with at least one conductive powder 140 (as shown in FIG. 20). The method continues with block S160 in which an annealing process is performed to the conductive powder 140 to form conductors 142 (as shown in FIG. 21). The method continues with block S170 in which a planarization process is performed to the graphene-based conductive layer 128 and the conductors 142 until the second dielectric layer 122 is exposed (as shown in FIG. 22).

As shown in FIG. 20, recesses 138 defined by the graphene-based conductive layer 128 are filled with at least one conductive powder 140. In some embodiments, the conductive powder 140 includes at least one metal powder. In some embodiments, filling the recesses 140 with the conductive powder 140 is performed by using a coating process. For example, in some embodiments, the conductive powder 140 is mixed into a liquid, and the graphene-based conductive layer 128 is coated with a mixture of the liquid and the conductive powder 140. In some embodiments, the liquid is volatile, and the conductive powder 140 is less prone to oxidation damage in the liquid. Examples of the liquid include, but are not limited to, alcohol, iso-propyl alcohol (IPA), and alkane. In some embodiments, after the coating, the liquid is vaporized, and the conductive powder 140 remains in the recesses 140. In some embodiments, before mixing the conductive powder 140 with the liquid, the conductive powder 140 is classified base on its particle size. In some embodiments, the particle size of the classified conductive powder 140 is below about 10 nm.

As shown in FIG. 21, an annealing process, such as a laser annealing process, is performed to the conductive powder 140 to form conductors 142. In some embodiments, during the laser annealing process, at least one laser beam L is applied to the conductive powder 140, so as to heat the conductive powder 140. As the conductive powder 140 is heated to reach the melting point, the conductive powder 140 melts and the aggregates, so as to become the conductors 142. For example, with the laser annealing process, the conductors 142 are formed by agglomerating the melting conductive powder 140. In some embodiments, other annealing processes, such as rapid thermal annealing, spike annealing or the like, can be used.

As shown in FIG. 22, a planarization process is performed to the graphene-based conductive layer 128 and the conductors 142 until the second dielectric layer 122 is exposed. In some embodiments, remaining conductors 142 are embeddedly retained in the recesses 138, and the remaining conductors 142 vertically overlap with CNTs 116 within the first holes 110 respectively. In some embodiments, top surfaces of the remaining conductors 142 are substantially level with end surfaces of the graphene-based conductive layer 128, and end surfaces of the second catalyst layer 126 are substantially level with the end surfaces of the graphene-based conductive layer 128. In some embodiments, the planarization process includes a CMP process.

As described above, the semiconductor device includes the CNTs and the graphene-based conductive layer. Since the CNTs and the graphene-based conductive layer have low resistance, the conductivity of the semiconductor device is improved. In addition, since the dimension of the CNTs is nanoscale, shrinkage of the semiconductor device can be improved.

According to various embodiments of the present disclosure, a semiconductor device includes a non-insulator structure, at least one CNT, a dielectric layer, and a graphene-based conductive layer. The CNT is over the non-insulator structure. The dielectric layer surrounds the CNT. The graphene-based conductive layer is over the at least one CNT.

According to various embodiments of the present disclosure, a semiconductor device includes a non-insulator structure, a CNT, a first dielectric layer, a second dielectric layer, and a graphene-based conductive layer. The CNT is within the first dielectric layer and is electrically connected to the non-insulator structure. The CNT is within the first dielectric layer. The second dielectric layer is over the first dielectric layer. The graphene-based conductive layer is within the second dielectric layer and electrically connected to the CNT.

According to various embodiments of the present disclosure, a method for manufacturing a semiconductor device is provided by follows. A hole is formed in a first dielectric layer over a non-insulator structure. A CNT is formed in the hole and is electrically connected to the non-insulator structure. A second dielectric layer is formed over the CNT and the first dielectric layer. A trench is formed in the second dielectric layer and a top surface of the CNT is exposed. A graphene-based conductive layer is formed in the trench and is electrically connected to the CNT.

The foregoing outlines features of several embodiments so that those skilled in the art may better understand the aspects of the present disclosure. those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a non-insulator structure formed in one of a source/drain region and a gate structure;
   at least one carbon nano-tube (CNT) over the non-insulator structure;
   a dielectric layer surrounding the CNT; and
   a graphene-based conductive layer over the at least one CNT.

2. The semiconductor device of claim 1, further comprising:
   a conductive material filling interspaces between a plurality of the at least one CNTs.

3. The semiconductor device of claim 2, wherein the non-insulator structure comprises a metal silicide, and the metal silicide and the conductive material comprise the same metal.

4. The semiconductor device of claim 1, further comprising:
   a catalyst layer between the at least one CNT and the non-insulator structure.

5. The semiconductor device of claim 4, wherein the catalyst layer and the non-insulator structure comprise the same metal.

6. The semiconductor device of claim 1, further comprising:
   a catalyst layer between the graphene-based conductive layer and the at least one CNT.

7. The semiconductor device of claim 6, wherein the catalyst layer wraps around the graphene-based conductive layer.

8. The semiconductor device of claim 1, further comprising:
   a conductor, wherein the graphene-based conductive layer wraps around the conductor.

9. The semiconductor device of claim 8, wherein a top surface of the conductor is substantially level with an end surface of the graphene-based conductive layer.

10. A semiconductor device, comprising:
    a non-insulator structure;

a carbon nano-tube (CNT) electrically connected to the non-insulator structure;

a first dielectric layer, the CNT being within the first dielectric layer;

a second dielectric layer over the first dielectric layer; and a U-shaped graphene-based conductive layer within the second dielectric layer and electrically connected to the CNT.

11. The semiconductor device of claim 10, further comprising:

a first catalyst layer; and a second catalyst layer, wherein the CNT is in between the first catalyst layer and the second catalyst layer.

12. The semiconductor device of claim 11, wherein the CNT is in contact with the first catalyst layer.

13. The semiconductor device of claim 11, wherein the U-shaped graphene-based conductive layer is in contact with the second catalyst layer.

14. The semiconductor device of claim 11, further comprising:

a metal wrapping around the CNT.

15. The semiconductor device of claim 11, further comprising:

a metal, wherein the U-shaped graphene-based conductive layer is disposed on sidewalls and a bottom surface of the metal.

16. A method for manufacturing a semiconductor device, comprising:

forming a hole in a first dielectric layer over a non-insulator structure;

forming a carbon nano-tube (CNT) in the hole and electrically connected to the non-insulator structure;

forming a second dielectric layer over the CNT and the first dielectric layer;

forming a trench in the second dielectric layer and exposing a top surface of the CNT; and after forming the trench, forming a graphene-based conductive layer in the trench and electrically connected to the CNT.

17. The method of claim 16, wherein the forming the CNT comprises:

forming a catalyst layer in the hole; and growing the CNT over the catalyst layer.

18. The method of claim 16, further comprising:

filling the hole with a metal after the forming the CNT.

19. The method of claim 16, wherein the forming the graphene-based conductive layer comprises:

forming a catalyst layer in the trench; and growing the graphene-based conductive layer over the catalyst layer.

20. The method of claim 16, further comprising:

filling the trench with a metal after the forming the graphene-based conductive layer.

* * * * *